United States Patent [19]

Cooray et al.

[11] Patent Number: 4,795,660

[45] Date of Patent: Jan. 3, 1989

[54] METALLIZED POLYMER COMPOSITIONS, PROCESSES FOR THEIR PREPARATION AND THEIR USES

[75] Inventors: Boyd Cooray, Bamford, United Kingdom; Peter Hope, MK Twello, Netherlands; Jan Vleggaar, HB Doetinchem, Netherlands; Kees Helle, JS Bennekom, Netherlands; Arie Roos, ET Velp, Netherlands

[73] Assignee: Akzo N.V., Netherlands

[21] Appl. No.: 861,231

[22] Filed: May 8, 1986

[30] Foreign Application Priority Data

May 10, 1985 [GB] United Kingdom ............... 8511905

[51] Int. Cl.$^4$ .......................... B05D 5/12; H01B 1/02; C23C 14/00
[52] U.S. Cl. .................................. 427/123; 427/124; 427/126.5; 427/126.6; 427/125; 427/419.1; 427/443.1; 427/296; 427/135; 204/192.12; 204/192.14; 204/192.15; 252/512; 252/513; 252/518; 252/519; 106/1.22
[58] Field of Search ...................... 106/1.22; 252/512; 427/443.1, 419.1, 296, 135, 123, 124, 125, 126.1, 126.3, 126.5, 126.6; 204/192.1, 192.12, 192.14, 192.15

[56] References Cited

U.S. PATENT DOCUMENTS 3,620,834 11/1971 Duffy ................................ 117/213
4,459,330 7/1984 Krause ........................... 427/443.1

FOREIGN PATENT DOCUMENTS 125617 11/1984 European Pat. Off. .
2022109 5/1970 Fed. Rep. of Germany .
8302784 8/1983 PCT Int'l Appl. .
1309320 1/1969 United Kingdom .

OTHER PUBLICATIONS

Journal of Vacuum Science and Technology, vol. 9, No. 1, pp. 354–356, Modern Plastics Encyclopedia 1983–1984, pp. 358–374.

Primary Examiner—Josephine Barr
Attorney, Agent, or Firm—Louis A. Morris

[57] ABSTRACT

Metallized polymer compositions are disclosed, the surface of which comprises an intermetallic compound of a metal element A (Sn, As, Sb or Bi) and a metal element B (Fe, Co, Ni, Cu, Zn, Ga, Ru, Rh, Pd, Ag, Cd or In), preferably an intermetallic compound of antimony and a metal element B. Processes for producing such metallized polymer compositions involve either the reduction of a metal element A compound in the presence of metallic metal element B and the polymer or the compression of a laminate of metal element A and metal element B layers onto the polymer. The metallized polymers are useful in the production of printing circuit boards, electromagnetic interference shielding devices, membrane switches, capacitors, conductive fibers, magnetic tapes and disc, antistatic mats, barrier polymers and optical storage devices.

18 Claims, No Drawings

METALLIZED POLYMER COMPOSITIONS, PROCESSES FOR THEIR PREPARATION AND THEIR USES

BACKGROUND OF THE INVENTION

The present invention relates to polymer compositions which are metallized, in particular with intermetallic compounds. The invention also relates to convenient processes for preparing such metallized polymer compositions. Furthermore, the invention relates to a process for producing electrically conductive films. Finally, the invention envisages advantageous uses of the processes.

In the development of currently available commercial processes of producing satisfactory metal-to-plastic bonding the plating of polymeric materials has met increasing interest and found widening applications. The replacement for metal articles by plastic items obviously offers the advantages of lower cost, higher production speed, wider design latitude, weight savings and fewer corrosion problems in view of the applicable extrusion and injection molding techniques, and the inherent properties of the polymeric materials. For many application purposes, however, a metallic coating on the polymeric article is desirable, since in that way the hardness, wear resistance, shiny appearance and metallic feel characteristic of metals is imparted to the polymeric substitutes. Furthermore, mention should be made of printed circuit boards which comprise dielectric substrates carrying metal electrical circuits. Finally the plating of plastic articles has found application in shielding electromagnetic interference (EMI) from electronic equipment. This EMI causes problems to advanced electronic devices of great sensitivity. Regulations concerning this new electronic pollution are or will be effective in USA and Europe.

Since most plastic surfaces are not electrically conductive, the traditional electroplating methods are not quite suitable for providing a metallic coating. Currently, however, electroless plating is one feasible method for the plating of polymeric materials. Though the development of chemical etchants resulting in a controlled microporous surface of the polymeric material and greatly improved electroless plating baths has led to metal depositions which adhere well to the polymeric surface and may serve as a conductive preplating for subsequent electroplating, all electroless plating processes are labor intensive, complicated and hence expensive. For example, a typical electroless plating procedure involves the steps of etching the polymeric material with strongly oxidizing solutions of chromic acid in order to physically roughen the polymeric surface and chemically modify it to give it a hydrophilic nature, neutralizing it with a mildly acidic or basic reducing agent for removing the detrimental hexavalent chromium, sensitizing it with stannous chloride and palladium chloride for nucleation of palladium, accelerating it with acidic or basic solutions for removing excess tin and exposing palladium nuclei and electroless depositing metals such as nickel and copper on it from a plating bath.

A method for high-speed production of metal-clad articles is disclosed in the International Patent Application No. WO 02784, which method comprises electroplating the injection molding die surface prior to each molding operation of a plastic article and the transfer of the electrodeposit to the plastic surface as a result of the higher adhesion of the electrodeposit to the plastic article formed than to the surface of the mold member. This method, however, requires the preliminary formation of the metallic layer and subsequent bonding to the polymeric article during formation of the latter.

Further, it is known from GB Patent No. 1,309,320 that flammable plastics can be compounded with combinations of halogen containing low molecular weight compounds and antimony trioxide. It is stated therein that certain additives tend to effloresce through lack of compatibility with the plastics material, which over a period of time, can result in thick coatings being formed on the surfaces of molding or machine parts. The nature of such coatings, however, is not defined, and no use is mentioned.

From EP Patent Application No. 125,617 it is known to metallize polymer compositions by heat treatment of a composition of a polymer and an organic complex of a transition metal element. A metallized surface film was obtained when the heat treatment was conducted with the polymer composition being in intimate contact with a metallizing board, which had to be made of a material having adequate heat resistance and to be readily releasable from the metallized film. The metal layers obtained did not contain a main group element.

In U.S. Pat. No. 3,620,834 a method is disclosed for metal plating plastic materials, wherein a substrate is successively pretreated with a main group V element trichloride and a source of sulfide prior to electrodeposition of Ni or Cu by conventional techniques.

From German Patent Application No. 2,022,109 it is known to treat in the presence of a solvent the surface of a plastic article with a dissolved metal salt complex, such as $SnCl_2$. DMSO, which diffuses into the plastics material during treatment and is anchored therein. The surface treated may be sensitized with a different metal salt, such as $AgNo_3$, under reducing conditions, so that a metallic layer of the latter metal is deposited. The treatment bath must be renewed as it is depleted and the silver tends to plate on the process equipment, causing a very untidy condition.

U.S. Pat. No. 4,459,330 discloses a wet process for plating a main group metal on aromatic polymers by the use of a non-aqueous solution of a salt of an alkali metal in a positive valency state and a main group metal in a negative valency state, for example $K_4Sn_9$. Metal plating is accomplished by immersion of the polymer into the solution followed by washing with toluene.

An article in The Journal of Vacuum Science and Technology, Vol. 9, No. 1, pp. 354–6 describes the preparation of intermetallic compounds, specifically of niobium and tin, $Nb_3Sn$, by coevaporation of two metals onto a rotating surface. A plurality of successive thin layers each of the thickness of approximately one lattice constant should be deposited for properly producing the intermetallic compound, which finally is collected from the carrying surface.

Other current techniques, such as vacuum metallizing and cathode sputtering, are available (Modern Plastics Encyclopedia 1983–1984, p. 358–374), but are not always useful.

In view of the increasing need for plated polymeric articles it will be clear that there is still a great demand for such a simple method providing an adhering interface between a polymeric material and a metallic or psuedo-metallic layer, that will be less cumbersome and complicated than the prior art methods discussed above.

The present invention thus has for its primary objectives the providing of a relatively simple method for metallizing polymeric materials as well as the obtaining of a novel metallized polymer composition.

SUMMARY OF THE INVENTION

Accordingly, the present invention, in the first embodiment, comprises a metallized polymer composition, of which the surface is at least partially metallized with a surface layer comprising an intermetallic combination containing a metal element A selected from the group consisting of tin, arsenic, antimony and bismuth and a metal element B selected from the group consisting of iron, cobalt, nickel, copper, zinc, gallium, ruthenium, rhodium, palladium, silver, cadmiun and indium.

In a second embodiment, the present invention comprises a process for preparing a metallized polymer composition comprising reacting a compound or mixture of compounds containing a positively valent metal element A selected from the group consisting of tin, arsenic, antimony and bismuth with a metallic source of a metal element B selected from the group consisting of iron, cobalt, nickel, copper, zinc, gallium, ruthenium, rhodium, palladium, silver, cadmium, and indium. The reaction is effected at the surface of the polymer composition under metallizing conditions such that a surface layer is formed on the polymer composition comprising a intermetallic combination containing both the metal element A and the metal element B.

In a third embodiment, the present invention comprises a process for preparing a metallized polymer composition. The process comprises bringing into contact at least one layer of zero-valent antimony and at least one layer of a metal element B selected from the group consisting of iron, cobalt, nickel, copper, zinc, gallium, ruthenium, rhodium, palladium, silver, cadmium and indium with a polymer or prepolymer composition under metallizing conditions such that a polymer composition is formed having a surface layer comprising an intermetallic compound of antimony and the metal element B.

In a fourth embodiment the present invention comprises a process for preparing electrically conductive films. The process comprises the steps of incorporating a compound or mixture of compounds containing a metal element A selected from the group consisting of tin, arsenic, antimony and bismuth and metallic particles comprising a metal element B selected from the group consisting of tin, arsenic, antimony and bismuth and metallic particles comprising a metal element B selected from the group consisting of iron, cobalt, nickel, copper, zinc, gallium, ruthenium, rhodium, palladium, silver, cadmiium and indium into a thermosetting polymer composition to obtain a paste. The paste is spread to form a film. The film is subjected to heating in such a manner that the thermosetting material is cured and the particles of metal element A react with the particles of metal element B to form surface layers on the internal surfaces of the thermosetting material which envelope the particles of metal element B. The surface layers comprise an intermetallic combination containing both the metal element A and the metal element B and are interconnected throughout the polymer matrix.

Other embodiments of the present invention encompass details about how the components of the invention are brought together, metallizing reaction conditions and compositions of the various components all of which are hereinafter disclosed in the following discussion of each of the facets of the invention.

DETAILED DESCRIPTION OF THE INVENTION

The metallic surface layer of the present metallized polymer compositions contains in an intermetallic combination at least two metal elements selected from each of the groups A and B defined above. Specific intermetallic compounds are $Cu_2Sb$, $FeSb_2$, $SbZn$, $Sb_3Zn_4$ and $InSb$. Such intermetallic surface layers appear to adhere well to the various polymer compositions. They are electrically conductive to an extent which depends upon the nature of the intermetallic compound and the thickness of the layer. For many of the applications mentioned earlier the electric conductively is sufficiently high and the present metallized polymer materials are useful as such. If desired, the intermetallic surface layers may be plated with any further metal or metal combination, which is effected most conveniently by electrodeposition in that the surface has become electrically conductive.

The term "intermetallic combination" as used herein is intended to include what are understood to be intermetallic compounds, such as $Cu_2Sb$, as well as metal alloys. There is some controversy in the literature as to the formal valency of the metal atom components of intermetallic compounds, the prevailing opinion being that all metal atoms in such compounds are zero-valent, although actually carrying a minimal charge.

The present metallized polymer compositions can be readily produced by techniques which are basically either of a chemical or of a physical nature. In the preferred process embodiments of the present invention such chemical or physical processes are effected when at elevated temperature and at elevated pressure the metallic precursors are in contact with the surface of the (pre) polymer composition to be metallized, so that the latter is in the thermoplastic state or is subject to a thermosetting reaction. It is believed that the excellent adhesion is at least partially due to such a contact during the formation of the intermetallic combination.

The processes of the present invention are thus in marked contradistinction to the above prior art which teaches metallization of polymer compositions only by the most complicated and difficult procedures. Such procedures involve wet processes, including electrodeposition, or electroless plating or provide no teaching of the obtaining of intermetallic surface layers on a polymer. The present invention is at least partially based on the surprising discovery that in the formation of an intermetallic combination at a polymer surface by the relatively simple methods of the present invention, the strong adhesion which occurs between the combination and polymer is at least as strong as the adhesions obtained by the prior art processes between a metal coating and polymer surface.

The compositions of the present invention comprising particular intermetallic combinations on a polymer surface are not known to the art and there does not appear to be any way the could be made by the known processes. In particular, electroless deposition baths are chemically reactive metastable solutions which upon contact with catalytic nucleation centers spontaneously deposit the Cu or Ni metal from the baths. It is not conceivable that mixed baths could be employed to obtain the composition of the present invention. There is no reason to believe that the tin (IV) ions which stablize and effect bonding of the palladium catalyst to the polymer prior to the electroless plating step are to any extent reduced to zero valance in the course of the plating so as to form even the smallest amount of intermetallic combination.

In the broadest embodiment of the chemical process of the invention which employs a compound or mixture of compounds containing the metal element A such compound and the source of a metal element B are simply brought together to be reacted on the surface of the polymer composition to be metallized. Reaction products containing metal elements A and B will be deposited to form a surface layer on the polymer composition. If necessary, reaction may subsequently be initiated by elevating temperature and/or pressure. Usually the invention will employ, in this embodiment which involves a chemical process, a stoicheometric excess of element B. In the course of the reaction a portion of metal element B will replace element A in the compound or compounds while a further portion of element B will join with element A in the intermetallic combination. Metal element A is selected from the group consisting of tin, arsenic, antimony and bismuth, while metal element B is selected from the group consisting of iron, cobalt, nickel, copper, zinc, gallium, ruthenium, rhodium, palladium, silver, cadmium and indium. A surface layer will be formed on the polymer composition containing both the element A and the metal element B.

It is the combination of a metal element A with a metal element B that is critical to the present invention. A combination of two group A metals or two groups B metals could not be applied as a metallic coating by the chemical and physical processes of the invention, because the chemical reactions and diffusion phenomena on which the invention relies do not occur between such combinations.

The source of metal element B may be of a pure metal element B, but may also be of an alloy thereof. But the metal element B will be contained in its zero valency state. Preferably the metal element B is chosen from the group consisting of nickel, copper, zinc and indium. Within this group copper is especially preferred. When copper is selected as the metal element B, the surface layer obtained has been proven to be an excellent base for further electrodeposition.

The chemical process embodiment of the invention may employ a metallic surface which functions both as a source of a metal element B and as a support surface. The support surface may be the metallic surface of a bulk body of homogeneous composition, or a metallic coating on a body of any other composition such as foil of metal B placed on the surface of a standard mold. The polymer composition is pressed on to this metallic surface in the presence of the metal element A compound, which may previously have been applied to either surface or to both surfaces of the polymeric and metallic materials by common procedures such as spraying, dusting or brushing.

The compound or mixture of compounds containing the metal element A may be incorporated into the polymer composition before the latter is pressed onto a metallic surface containing the metal element B. This embodiment may be preferred, if the contact face is of irregular shape and the contacting is to be combined with a molding operation of the polymer composition. Under suitable process conditions the compound or mixture of compounds, or further products formed thereof will prove to be sufficiently mobile in the polymeric mass to reach the surface of the polymer mass within the applied time parameter, so that a thick surface layer relative to the concentration in the bulk of the polymer composition can be formed.

Effective compositions may further contain suitable inert excipients.

Of course, the basic features of the above embodiments may be combined within the scope of the invention. For example a metallic surface containing a metal element B may be used, and further metallic particles containing a metal element B may be provided between the metallic surface and the polymer composition together with the metal element A compound. In that case the metallic surface and the metallic particles may contain different metal elements B.

The essential reactions of the compound or mixture of compounds containing the metal element A may take place at the surface of metal element B metallic particles surrounded by the polymer composition. In that case the metallic particle will remain enveloped within a polymeric layer containing on its internal surface the deposited combination of the metal elements A and B which is formed in the process of the invention. Since this layer appears to be in electrically conductive contact with the metallic particle contained therein, its formation according to the invention may be used in the production of electrically conductive films.

The process for producing the electrically conductive films comprises the steps of incorporating a compound or mixture of compounds containing a metal element A and metallic particles containing a metal element B into a thermosetting polymer composition to obtain a paste, spreading the paste to form a film, subjecting the film to heating in such a manner that the thermosetting material is cured and the metal element A is brought into reaction with the metallic particles. This results in the formation of a network of polymeric envelopes containing individual metallic particles with the internal surface of the envelopes having a surface layer comprising an intermetallic combination containing the metal element A and the metal element B. These internal surfaces with their metallic surface layer are interconnected throughout the polymer matrix, thus rendering the film conductive.

The thickness of the conductive film made from the above paste may range from about 10 to about 1000 microns. The curing temperature may range from ambient to about 250° C., preferably about 50° to about 125° C. The components in the paste mixture may comprise from about 20 to about 70 wt. % of metal element B finely divided (0.1-20 microns diameter) particles (such as Cu), about 20 to about 70 wt. % of curable binder (such as urethane) and about 5 to about 40 wt. % of finely divided particles of metal element A compound (such as $SbCl_3$). The paste may optionally contain 0-200 wt. %, based on the total weight of the above components, of a volatile diluent (such as butanone).

The expression "metal element", as used in the present specification and claims, is meant to encompass both metal elements and semi-metal elements, since no sharp division between them can be made. "Polymer composition" is any composition containing a polymer or copolymer as main constituent together with any additives being inert in the present process. The (co)polymers may be thermoplastic or thermosetting.

In the chemical process according to the invention use is made of a compound or mixture of compounds containing a metal element A which will be in a positive valency state. Of course, in the surface layer forming stage of the process at least one reactive compound must be present, but such a reactive compound may very well be formed in situ, in which case a mixture of compounds is used comprising precursors for the reactive compounds. Such precursors will in general comprise an inactive or less reactive source of the metal element A as first constituent and an activating compound as second constituent. The use of precursors may be preferred in view of the availability of starting materials and most of all when an induction time, induction temperature or induction pressure are desirable, for initiating the surface layer forming reaction rather than the reaction occuring spontaneously as soon as the reactants are brought together.

In its broadest scope the invention comprises the formation of surface layers containing a metal element A selected from the group tin, arsenic, antimony and bismuth. In order to obtain mixed surface layers it is of course within the scope of the invention to use reactive compositions containing more than one of these metal elements A indicated. Reactive compounds of the metal element A comprise, for example, hydrides, halides, phosphides, sulfides, nitrates, carboxylates and tartrates and mixed compounds of the metal elements mentioned above. Examples are halides, such as stannous chloride, antimony trichloride, bismuth trichloride, bismuth pentabromide, antimony chloro dibromide, bismuth difluoro chloride, phosphides such as tin phosphides, sulfides such as arsenic sulfide, antimony sulfide, hydrides, and mixed compounds such as antimony iodo sulfide, and bismuth oxyfluoride.

Other sources of the metal element A usable in the process of the invention, which may be less reactive or inactive and which preferably are used as precursors in combination with an activating compound, include oxides, some sulfides, nitrides, salts of mineral acids, amphoteric oxides and salts of amphoteric elements, and carbonates of the metal elements mentioned before. Also included are complexes or chelates of these metals and organo metal derivatives. Specific examples are arsenic oxide, bismuth oxide, tin oxides, etc.

Examples of compounds of anitmony, a preferred metal element A, include antimony oxides, nitrates, oxyhalides, stearates and mercaptoacetates, organoantimony compounds, and organic chelates of antimony.

When a precursor to a reactive compound of the metal element A is employed, a second constituent is required, which will provide the halogen, sulfur, phosphorous, hydrogen, nitrate, carboxylate or tartrate group for formation of the reactive compounds. As the halides of antimony, bismuth and tin are the preferred compounds for use in the process of the invention, the second constituent of the precursors preferably comprises a halogen source, which may contain the halogen both as a radical and as an ion. The halogen source may comprise organic chloro, bormo, fluoro and iodo compounds as well as inorganic chloro, bromo, fluoro and iodo compounds including organo metallic halides. The halogen source may be a halogen containing polymeric component of the polymer composition.

To produce a metallized polymer composition, the invention provides a second process, which is basically of a physical nature, in which process at least one layer of zero-valent antimony together with at least one layer of a metal element B selected from the group consisting of iron, cobalt, nickel, copper, zinc, gallium, ruthenium, rhodium, palladium, silver, cadimium and indium are brought into contact with a polymer or prepolymer composition under conditions such that a polymer composition is formed having a surface layer comprising an intermetallic compound of antimony and the metal element B. So, for example, it has been observed that when subjecting a laminate of a copper foil, an intermediate relatively thin layer of antimony and a plastics sheet, such as an ABS-sheet, to heat and pressure the antimony diffuses into the copper surface layer with formation of the $Cu_2Sb$ intermetalalic compound. After cooling the bond between the ABS-sheet and the intermediate $Cu_2Sb$ layer appears to be stronger than the bond between the $Cu_2Sb$ layer and the remainder of the copper foil. When the ABS-sheet is separated from the copper foil, together with the antimony diffused therein is transferred to the ABS-sheet in the form of a well-adhering intermetallic compound coating.

In the physical process of the invention both the antimony and the metal element B are provided as zero-valent starting materials in separate layers. The layers are provided on top of each other and then together they are pressed onto the polymer composition, preferably at elevated temperature. The polymer composition may be in direct contact with either an antimony or a metal element B layer.

Conveniently, a layer of antimony is deposited upon a metal element B layer, which in itself may be layer deposited on an inert release substrate, in which case the total matter if the two deposited layers in the form of a single intermetallic compound layer is transferred from the release substrate to the polymer composition surface. Alternatively, the metal element B layer is constituted by the surface layer of a bulk body consisting essentially of the metal element B, in which case a thin surface layer thereof is combined with the antimony to form the intermetallic compound and transferred to the polymer composition surface.

In one embodiment of the physical process of the invention a layer of antimony is deposited, for example electrodeposited, onto a foil of the metal element B, whereupon the coated foil is pressed onto a polymer composition and the assembly is kept at an elevated temperature for a sufficiently long time to complete formation of the intermetallic compound. After cooling the polymer composition carrying at its contact surface a layer of the intermetallic compound is separated from the foil, which after cleaning, if desired, may be used in a next cycle. Since in each cycle some of the metal element B is removed from the foil, it can only be used in a limited number of cycles. An advantage of this embodiment, however, is the fact that the thicknesses of the starting layers are not critical, since the formation of the intermetallic compound will just consume the stoechiometrically required amount relative to the amount of antimony deposited.

According to another embodiment of the physical process of the invention an inert release substrate, for example an endless belt, is provided, on which a layer of antimony and a layer of the metal element B are consecutively deposited, for example by electrodeposition, in either sequence. Any desired number of layers may be deposited in a sandwich-like arrangement.

Thereupon, the inert substrate carrying the combined depositions is pressed onto a polymer composition, which for example is in the form of an endless foil, at elevated temperature. The deposited layers of antimony and the metal element B may be preheated for a certain time in order to avoid too long residence times of the polymer composition in the heated contact step. Finally, the polymer composition coated with the intermetallic compound may be separated from the inert release substrate. This second embodiment may advantageously be carried out in a continuous mode.

The combined layers of antimony and the metal element B may also be brought into contact with a prepolymer composition comprising precursors of the final polymer. For example, such precursors may be charged upon an endless belt previously coated with antimony and metal element B layers, whereupon the assembly is heated and pressurized, inducing both the intermetallic compound formation and the polymerization.

Although electrodeposition is preferred, any other known method for depositing a metal layer upon a substrate, such as electroless deposition, vacuum metallizing, and cathode sputtering may be used to prepare the assembly of layers of antimony and the metal element B respectively.

The process conditions of both the chemical and the physical process of the invention may in principle by widely varied. The process temperature will be limited by the degree of heat stability of the polymeric material used. Low temperatures should be avoided if they lead to lengthy reaction times. Preferably the processes of the invention are carried out at a temperature in the range of from ambient to 600° C., whereas a range of from 125° C. to 375° is particularly preferred, and a range of from 200° C. to 250° is most preferred.

In principle any pressure may be used in the processes of the invention. In many cases, however, better contacting will be achieved at elevated pressures. Preferably the pressure ranges from 100 kPa to 100 MPa abs and most preferably from 100 kPa to 10 MPa. Temperatures and pressures for a given system of metal A or metal A compounds, metal B and polymeric material, which are appropriate for obtaining the intermetallic compound of metals A and B that adheres to the polymer surface, referred to herein as "metallizing conditions", can easily be determined empirically for any given case by one of ordinary skill in the art without undue experimentation.

The polymer composition used in the process of the invention comprises polymers such as thermoplastics, thermosets, thermoplastic rubbers, elastomers and their blends. Examples of suitable polymers are polyolefins, polystyrenes, polyvinyl halides, polycarbonates, polyesters, polyamides, polyimides, polyetherimides, polysulfones, polyethersulfones, polyetheretherketone, polyacrylonitrile, polychoroprene, polyphenylene oxide, fluoropolymers, silicones, cellulosics, chlorosulphonated polyethylene, nitrilebutadiene rubbers, polyurethyanes, phenolformaldehyde resins, melamine formaldehyde resins and urea formaldehyde resins and copolymers thereof. Of special advantage is the use of copolymers of acrylonitrile, butadiene and styrene. Especially important are fire retardant grades of polymers.

Further examples of suitable (co)polymers include polypropylene oxide, polypropylene sulfide, polyacrylates, polyalkylacrylates, polysulfide polymers, polythiazoles, polyethers, polythioethers, polyureas, polyvinyl acetates, polyvinyl alcohol, polyvinyl butyral, polyvinyl carbazole, polyvinyl fluoride, poly(p-phenylene), polyacetates, polyacreolein, polyacrylic acid, phenolics, epoxy resins, and ethoxylated bisphenol-A-dimethacrylates.

The polymer compositions used may comprise the above polymers in combination with common fillers, diluents, reinforcing agents, extenders and similar additives, such as stabilizers, antioxidants, pigments, etc. The additives may include quaternary ammonium salts for increasing the polarity of the polymer composition, which may in some case improve the adhesion to the polymer surface and/or the mobility of the reactive compounds containing the metal element A in the plastic polymeric mass during contacting.

In the processes according to the invention, the metallization is effected at temperatures and pressures as indicated above during periods of time ranging from a few seconds to a number of minutes or several hours, depending on the thickness of the surface layer desired and the process parameters. The polymer composition may be premolded and simply placed on contact with a metallic surface of similar shape. Optionally the polymer composition is pressed against the the metallic surface. Preheating to the desired process temperature may be effected prior to contacting, but alternatively the assembly of metallic surface and polymeric material may be pressed together first and subsequently be heated.

If partial coating of the polymeric molding is desired, the polymeric molding may be contacted with a partially embossed surface or the composition containing the metal element A may be present in pre-determined contact face areas.

According to the invention contacting also may be effected during the molding of a polymeric article. In that case a metallic mold or a mold lined with a metallic sheet will provide the metallic surface which will both be determinative of the shape of the molded polymeric article and lead to the formation of the surface layer desired. The use of a metallic lining will lead to avoiding any loss of material from the mold and hence any change in the configuration thereof.

The surface layer of the metallized polymer composition according to the invention, which contains the metal element A and the metal element B, is strongly bonded to the polymeric material. The thickness of the surface layer may range from 0.01 to 100 microns, preferably from 0.1 to microns, depending on the process parameters.

Alternatively, the surface layer of the polymeric article may be thickened by further deposition of metal. Since the surface layer formed is electrically conductive it may serve as a preplating in a electrodeposition process. Other, more cumbersome, methods may also be applied. Thus, any metal may be deposited upon the surface layer if reinforcement or functionalization of the surface is the primary object. However, if enhancement of the conductivity is envisaged, it is preferred that use should be made of copper. Electrodeposited copper layers were found to display a strong bond to the surface layer formed according to the invention.

The scope of the invention permits many advantageous uses of the present processes. All fields of application of plated plastics or the formation of laminates may benefit from the simplicity and convenience of the present processes. The process of the invention may be beneficially used, for example, in the manufacture of printed circuit boards, for electromagnetic interference shielding purposes, in the manufacture of membrane switches, for the decorative or functional coating of polymeric articles, for providing wear resistance to polymeric surfaces, for the manufacture of magnetic tapes or discs, anti-static mats or conductive fibers, in the production of capacitors, in the production of barrier polymers, in the production of laminates and in the manufacture of tapes or discs of optical storage.

The surface layers obtained in the process of the invention show an inherent electrical conductivity which is sufficiently high for electromagnetic interference shielding purposes. In the manufacture of a housing for an electronic device an intimate mixture of acrylonitrile butadiene styrene polymeric material, antimony oxide and trichloro acetic acid ester is injected into a mold lined with metallic copper. During molding a conductive antimony and copper containing surface layer of the polymeric material is formed at the contact face with the copper lining, providing a conductive coating of the polymeric article upon release from the mold. Generally, this surface layer will be overcoated with a paint for decoration and protection.

In the manufacture of printed circuit boards epoxy resin impregenated substrate boards may be pressed onto stannous chloride coated copper foils, resulting in a conductive surface layer being formed on the substrate board. Common semi-additive printed-circuit processing techniques may then be used to provide a high-conductivity copper circuit pattern.

In the manufacture of membrane switches, a paste comprising a mixture of polymeric binder and metallic copper powder coated with antimony trichloride may be applied to a substrate in accordance with a particularly derived circuit pattern. Heating will cause both the curing of the binder and the formation of an antimony-containing coating around each copper particle, so that antimony coatings of adjacent copper particles will coalesce with reduction in the resistivity of the circuit pattern obtained.

The outer surface of the metallic layer deposited on a plastic surface, by the present process, becomes well adhered to a new plastic surface under the normal laminating conditions known to those familiar in the art. The new plastic surface may or may not be of the same composition or structure as the initial plastic substrate on which the metallization process was carried out. The laminating of different plastic materials through sandwich layer of metallic composition laid down by the process described herein, leads to strengthening and reinforcement of plastic laminates and enables overcoming incompatibility hindrances associated with the blending and laminating of structurally diverse polymers.

The invention will further be illustrated by the following non-limiting examples.

EXAMPLES

Example 1

Cycolac T 10,000 ABS (Trademark) (an ABS polymer of 10,000 molecular weight supplied by Borg Warner) granules (93.9 g) were compounded with 6.0 g of antimony trichloride (ex. BDH Ltd GPR grade) and 0.1 g of calcium stearate (employed as a lubricant) by milling on a two-roll mill (170° C. front roll, 165° C. back roll) for 5 minutes after gelation.

The milled sheet (1.0–1.2 mm thickness) was cut into 18.5 g. portions which were separately compression molded at 240° C. (2 minutes contact time, 5 minutes at 6.15 MPa and 2 minutes at 6.15 MPa while cooled) in contact with a copper-berrylium (98:2) foil to yield a blue-orange metallic coating on the portions of sheet which were easily separated from the foil upon the release of pressure.

Example 2

100 g of cycolac T 10,000 ABS granules were milled with 0.1 g of calcium stearate, on a two-roll mill (front roll 160° C.) for 5 minutes after gelation. The milled polymer was preformed into 9 cm×9 cm×0.16 cm sheets by compression molding in a suitable mold at 170° C.

A 9 cm ×9 xm×0.0125 cm copper-berrylium alloy (98 Cu/2 Be) foil was degreased and mounted on a plate and a solution of antimony trichloride in dichloromethane sprayed onto the foil ensuring the uniform deposition of 0.35 g of antimony chloride on the foil surface.

The sprayed alloy foil was placed on a compression mold such that its coated surface was in contact with a surface of the preformed ABS sheet. The polymer in the mold was subjected to hot compression (170° C., 6.15 MPa) followed by cooling. The mold was opened and the ABS sheet found to be coated with a metallic layer which remained adhered to the polymer after separating away the copper-berryliium alloy foil. The weight of the ABS sheet was found to have increased by 2.22%, at the end of the metallization step.

Example 3

Cycolac T 10,000 ABS granules were pre-formed into 9 cm×9 cm×0.16 cm sheets as in Example 2.

A 9 cm×9 cm×0.0125 cm copper-berrylium alloy (98 Cu/2 Be) foil was degreased and mounted on a plate and a solution of antimony trichloride in acetone carrying a suspension of ABS powder (DSM, MST powder) was sprayed onto the foil.

The sprayed foil was placed over the pre-formed ABS sheet in a compression mold ensuring that the coated surface was in contact with the polymer surface. The polymer was subjected to hot compression as in Example 2.

The ABS sheet was found to be metallized on its surface adjacent to the separated alloy foil and the metallic coating was remarkably smooth and uniform.

Example 4

91.55 g of cycolac T 10,000 ABs granules were compounded with 2.0 g of bismuth trioxide, 6.0 g of methyltrichlorobutyrate, 0.3 g of distearyl thiodipropionate, 0.15 g of Irganox 1076 and 0.1 g of calcium stearate as for Example 1.

Upon compression molding in contact with a copper-berrylium foil as in Example 1, a blue-orange metallic coating was formed on the ABS surface adjacent to the contact foil.

Example 5

91.55 g of cycolac T 10,000 ABS granules were compounded with 4.0 g of stannous oxide, 6.0 g of methyl trichlorobutyrate, 0.3 g of distearyl thiodipropionate, 0.15 g of Irganox 1076 and 0.1 g of calcium stearate as for example 1.

Upon compression molding as in Example 1, a grey metallic coating was formed on the ABS surface.

Example 6

A 9 cm×9 cm×0.15 cm sheet of cycolac T 10,000 ABS polymer was placed next to an anhydrous stannous chloride sprayed copper-berrylium foil and compression molded for 20 minutes at 240° C. (6.15 MPa) to yield a metallic coating on the polymer surface.

Example 7

90 g of cellulose acetate (Dexel crystal×1915, Trademark) was compounded with 10 g of antimony tris (trichlorobutyrate) in a Brabender mixer at 160° C. for 5 minutes after gelation.

30 g of the compounded composition was compression molded at 225° C. as in Example 1, to yield a metallic coating on the polymer surface.

Example 8

100 g of PVC (Corvic S 110/17, Trademark) powder was compounded with 30 g of dioctyl phthalate and 1.0 g of a common barium-zinc stabilizer and milled at 160° C. for 5 minutes.

A copper-berrylium alloy foil was sprayed with a solution of antimony trichloride in dichloromethane and a 14.0 g portion of the milled sheet cut and placed in a compression mold, over the coated foil surface.

The polymer was compression molded at 175° C. (6 minutes contact time, 3 minutes at 6.15 MPa) and cooled under 6.15 MPa to yield a metallic coating on the surface of the polymer sheet.

Example 9

Pre-formed polycarbonate sheets (15 cm×15 cm×0.1 cm) were purchased from Goodfellow, Cambridge, England and cut into 14 g pieces measuring 9 cm×9 cm×0.1 cm.

A copper-berrylium alloy foil was mounted on a plate and sprayed with a solution of antimony trichloride in dichloromethane.

A polycarbonate piece (14 g) was placed at the bottom of a compression mold chamber and the coated alloy foil positioned on top of the polymer ensuring contact between the polymer and antimony trichloride coated surface. The mold was warmed to 170° C. and after a 6 minute contact time to cause polymer gelation, a pressure of 6.15 MPa was applied for 3 minutes. Upon cooling and opening the mold the outer surface of the polycarbonate sheet was covered with a metallic layer which separated easily from the copper-berrylium foil.

Example 10

A 9 cm×9 cm×0.005 cm Melinex (Trademark) polyester film was placed next to an antimony trichloride sprayed copper-berrylium foil and compression molded for 2 minutes at 190° C. (6.15 MPa) to yield a metallic coating on the polymer surface.

Example 11

A 9 cm×9 cm×0.005 cm Kapton (Trademark) polyimide film was placed next to an antimony trichloride sprayed copper-berrylium foil and compression molded for 5 minutes at 240° C. (6.15 MPa) to yield a metallic coating on the polymer surface.

Example 12

A 9 cm×9 cm×0.155 cm copper-berrylium foil was sprayed with a solution of antimony trichloride in diethyl ether and the coated foil was placed in a compression mold.

35 g of the epoxy molding compound, Polyset 217 (ex. Dynachem Corporation, U.S.A., Trademark) was placed over the coated alloy foil and compression molded for 2 minutes at 150° C. under 6.15 MPa pressure.

After cooling the mold, the epoxy molding was found to have a metallic coating on the surface that was adjacent to the alloy foil during compression.

Example 13

79.5 g of Hoechst S6600 (Trademark), high impact polystyrene, 10.0 g of titanium dioxide (R900 Ti pure, Trademark), 0.5 g of calcium stearate and 10.0 g of antimony tris (trichlorobutyrate) were processed for 5 minutes on a two-roll mill (front roll 210° C., back roll 200° C.).

A 8 cm×8 cm×0.20 cm piece of processed composition was compression molded allowing 3 minutes contact time and 6 minutes compression (6.15 MPa) at 240° C. using two copper-berrylium alloy foils adjacent to the polymer.

After cooling, the polymer was found to have a metallic coating on each of the surfaces in contact with the alloy foil during compression.

Example 14

74.9 g. of polypropylene (Shell HY6100 N, Trademark), 10.0 g of titanium dioxide (R900 Ti pure), 4.0 g of antimony trioxide, 10.0 g of methyltrichlorobutyrate, 0.5 g of calcium stearate, 0.2 g Irganox 1076 and 0.4 g of distearylthiodipropionate were cross-blended on a two-roll mill (front roll 200° C., back roll 190° C.) for 5 minutes.

The blended composition was compression molded by allowing 3 minutes contact time prior to the application of 6.15 MPa pressure for 8 minutes at 240° C. after placing copper-berrylium alloy foils on each side of the polymer.

After cooling and foil separation, the polymer surfaces were found to be covered by an adherent metallic coating.

Examples 7–14 show that different polymeric materials, either thermoplastic or thermoset, may be metallized by the process of the invention. The polymer compositions may contain processing aids such as calcium stearate, and may optionally contain fillers, such as titanium dioxide.

Example 15

A sheet of cycolac T 10,000 ABS polymer (10 cm×10 cm×0.2 cm) was sprayed with a solution containing 5 g of antimony trichloride in dichloromethane, followed by fine particle copper powder (3 um).

The sheet was transferred to an air circulating oven at 90° C. for 10 minutes. The surface of the polymer sheet was found to have a uniform metallic coating.

This example shows that elevated pressures are not essential in the process of the invention. However, elevated pressures do improve the surface finish of the metallic coatings obtained.

Example 16

A 0.1 mm thick copper foil of 110 mm×150 mm was cleaned by the consecutive steps of etching the oxide skin in a bath containing 100 ml of $H_2SO_4$ per liter and 5 ml of $H_2O_2$ for 30 seconds at room temperature, rinsing in water for 30 seconds, cathodic-alkaline degreasing in a commercial degreasing bath for 3 min at 70° C. and thoroughly rinsing in cold water for 60 seconds. The wet copper foil was placed in an antimony plating bath containing 60 g of antimony trioxide per liter, 145 g of potassium citrate and 185 g of citric acid and cathodically antimonized at 50° C. and a current density of 1A/dm$^2$ for 2 min. An antimony layer of an estimated thickness of about 2 microns was thus electrodeposited onto the copper foil. The antimony coated copper foil was subsequently rinsed with water and ethanol, dried and immediately placed with its antimony face in contact onto a 2 mm thick ABS sheet of 100 mm×100 mm (Metzoplast H, TiO$_2$ pigmented of Metzeler GmbH).

This assembly was placed between the two flat plates of a press preheated to a temperature of 200° C. The pressure was gradually increased over 30 seconds to a total end load of 500 kg. The pressure and temperature were maintained for a further 90 seconds, whereupon it was cooled to a temperature of about 50° C. over 5 min, and then the pressure was released and the assembly taken from the press.

Finally the ABS sheet carrying a Cu$_2$ layer was separated from the copper foil.

In similar experiments thicker layers of antimony up to 10 um were electrodeposited onto the copper foil yielding thicker Cu$_2$Sb coatings of the ABS sheets. In many cases the Cu$_2$Sb coated ABS sheet was spontaneously released from the copper foil due to cooling tensions. In all cases the contact surface of the copper foil after fission only showed traces of residual Sb or Cu$_2$Sb.

The metallic surface layer of the ABS sheet was subjected to X-ray diffraction analysis by means of a Philips PW 1700 powder diffractometer (reflection technique) using CuKx radiation and a quartz monochromator. The recorder spectrum was computer analyzed, compared with standard spectra of the JCPDS library and demonstrated to be that of the copper-antimony intermetallic compound Cu$_2$Sb.

Measurement of the adhesion of the Cu$_2$Sb-layer to the ABS sheet was attempted on an Elcometer adhesion tester, to which end cylindric aluminium dies were glued onto the fresh Cu$_2$Sb surface of the coated ABS sheets. In 8 runs break tensions ranging from 150 to 413N/cm$^2$ were observed, however, the break occurred at the glue faces or within the ABS sheet. In no case was fission observed at the Cu$_2$Sb/ABS interface.

Example 17

An antimony coated copper foil was prepared as in Example 16. It was placed upon at 100 mm×100 mm×1 mm sheet of polyethersulfon (Ultrason E 2000 of BASF) previously dried at 130° C. under vacuum. After being placed in a press at 300° C. the assembly was subjected to a load of 500 kg for 5 min at that temperature, whereupon it was cooled and the pressure released to obtain a polyethersulfon sheet having a surface coating of metallic appearance, which by X-ray diffraction was proven to consist of Cu$_2$Sb.

Example 18

The experiments of Examples 16 and 17 were repeated using other polymeric materials:
polyetheretherketone (Victrex PEEK of ICI); press conditions: 5 min at 350° C.
polyetherimide (Ultem 1000 of General Electric); press conditions: 5 min at 350° C.
polyethyleneterephthalate; press conditions: 5 min at 250° C.
polybutyleneterephthalate; press conditions: 5 min at 250° C.
styrene acrylnitrile; press conditions: 5 min at 250° C.
In all cases metallized polymer sheets where obtained.

Example 19

Bonder steel plates were galvanized with sulfamate nickel to produce non-porous nickel coatings of about 10 microns thickness, which were sufficiently thick to prevent any exposure of free iron during the subsequent experiments. The nickel coated Bonder plates, after rinsing, were antimonized in the bath and under the conditions described in Example 16. One Ni/Sb-coated plate was preheated for 1 hour at 300° C. and subsequently pressed onto an ABS sheet as described in Example 16. A metallized ABS sheet was obtained, of which the surface layer was shown by X-ray diffraction to comprise the intermetallic compounds NiSb and NiSb$_2$.

The other Ni/Sb-coated plates were not preheated, but immediately pressed onto sheets of polyethersulfon, polyetheretherketone and polyetherimide as described before, at temperatures of 325, 350 and 350° C. respectively. In all cases intermetallic compound coatings were formed on the polymer sheet, comprising NiSb and/or NiSb$_2$.

No iron was detected in the intermetallic compound layers.

Example 20

A zinc plate of 100 mm×100 mm×1 mm was antimonized in the bath described in Example 16. Although the electroplating appeared to be suboptimal, local areas of antimony coating on the zinc plate could be obtained, which after pressing onto ABS at 250° C. produced an intermetallic compound coating comprising SbZn and smaller amounts of Sb$_3$Zn$_4$.

Example 21

An indium foil of 100 mm×15 mm×1 mm was antimonized as before. In view of the melting point of indium of 156° C. the coated foil was pressed onto an ABS sheet at a temperature of 150° C. The surface layer of the metallized ABS sheet comprised the intermetallic compound InSb.

Example 22

A cu$_2$Sb coated ABS sheet obtained as described in Example 16 was electroplated at room temperature and at a current density of 1A/dm$^2$ in a CuSo$_4$ bath. The deposited copper layer showed an excellent adhesion to the Cu$_2$Sb surface layer of the ABS sheet.

Example 23

Various pastes emboding the present invention were madeup, applied as a coating to a polyester film and then cured. A summary of the samples prepared is as follows:

| Ingredients (g) | Sample No. | | | | |
|---|---|---|---|---|---|
| | 1 | 2 | 3 | 4 | 5 |
| Cu Powder | 4 | 4 | 4 | 4 | 4 |
| Urethane | 5 | 5 | 5 | 5 | 5 |
| SbCl$_3$ | 2 | 3 | 4 | 5 | 6 |
| (a) Butanone | 2 | 3 | 5 | 3 | 3 |

-continued

| Ingredients (g) | Sample No. | | | | |
|---|---|---|---|---|---|
| | 1 | 2 | 3 | 4 | 5 |
| (b) T Butanone | 3 | 6 | 10 | 6 | 8 |

The Butanone and T Butanone were employed as solvents. There were two samples corresponding to each sample number, each sample employing one of the solvents.

The results obtained were as follows:

| Results | | Paste spreadability | Lumpiness | Conductivity |
|---|---|---|---|---|
| 1 | (a) | good | slightly | slight |
| | (b) | good | slightly | slight |
| 2 | (a) | good | slightly | moderate |
| | (b) | good | slightly | moderate |
| 3 | (a) | bad | Very lumpy | high |
| | (b) | bad | lumpy | high |
| 4 | (a) | poor | slightly | high |
| | (b) | good | slightly | high |
| 5 | (a) | poor | lumpy | high |
| | (b) | poor | lumpy | high |

The above results indicate that although there was a degree of variation in the ease of applying the coating, the quality of the coating and its conductivity, the invention was to varying degrees effective in all instances. Conductivity did appear to decrease somewhat after a certain time.

Example 24

A series of tests were carried out to determine the adhesive strength on polymers of the intermetallic compound surface layers of the present invention as compared to surface layers of prior art compositions comprising copper on polymer substrates prepared by prior art processes.

An Elcometer was used to measure the adhesive strength. An aluminum "dolly" was cemented to the metallized surfaces to be tested by means of an epoxy resin, the metallized film was cut through around the cemented dolly and the dolly finally attached to the Elcometer which is a precalibrated device which measures the force required to physically rip the metallized film from the substrate.

The two prior art samples prepared were electroless plated copper on ABS polymer and copper electrodeposited on epoxy.

The five samples prepared of the compositions of the present invention were Cu-Sb bulk mixed on ABS which was prepared as described in Example 1, Cu-Sb via coated foil on both ABS and epoxy which was prepared as in Example 2 and CuSb using Cu powder on both ABS and epoxy which was prepared as in Example 15.

The results of the tests were as follows:

| Metal Layer | Adhesion Strength (Neutons/cm$_2$) | |
|---|---|---|
| | ABS | epoxy |
| Electroless plated copper | 412 | |
| edc copper | | 441 |
| Cu—Sb bulk mixed | 510 | |
| Cu—Sb via coated foil | 480 | 314 |
| Cu—Sb using Cu—powder | 461 | 451 |

The above results indicate that the adhesive strength of the metallic surface layers of the present invention is at least comparable to that of the prior art coatings. When the relative ease and simplicity of the process of the invention is taken into account it clearly would be the process of choice over the processes of the prior art.

We claim:

1. A process for preparing a metallized polymer composition comprising reacting a compound or mixture of compounds containing a positive valent metal element A selected from the group consisting of tin, arsenic, antimony and bismuth with a metallic source of a metal element B selected from the group consisting of iron, cobalt, nickel, copper, zinc, gallium, ruthenium, rhodium, palladium, silver, cadmium, and indium at the surface of said polymer composition at a temperature and pressure appropriate for obtaining a surface layer on the polymer composition comprising an intermetallic combination containing both the metal element A and the metal element B.

2. The process of claim 1 wherein a support surface is provided which comprises said metal element B.

3. The process of claim 2, wherein said reaction is effected with said surface of said polymer composition being pressed onto said support surface with said compound or mixture of compounds being between said surface of said polymer composition and said support surface.

4. The process of claim 3, wherein said compound or mixture of compounds is first applied to said surface of said polymer composition.

5. The process of claim 3, wherein said compound or mixture of compounds is first applied to said support surface.

6. The process of claim 3, wherein said compound or mixture of compounds is first applied to both said surface of said polymer composition and said support surface.

7. The process of claim 2, wherein said support surface is of a shape that will determine the shape of the surface of the polymer composition to be metallized, said polymer composition being pressed onto said support surface to effect molding of said polymer composition during said reaction.

8. The process of claim 2, wherein said compound or mixture of compounds containing a positively valent metal element A is incorporated into said polymer composition prior to said reaction.

9. The process of claim 2, wherein said support surface comprises a mold on the surface of which a foil of the metal element B is placed.

10. The process claim 1 wherein said compound or mixture of compounds comprises a hydride, halide, sulfide, phosphide or carboxylate of the metal element A or its precursors.

11. The process of claim 1 wherein at least part of said surface layer is further plated by deposition of additional metal.

12. A process for preparing a metallized polymer composition comprising bringing into contact at least one layer of zero-valent antimony and at least one layer of a metal element B selected from the group consisting of iron, cobalt, nickel, copper, zinc, gallium, ruthenium, rhodium, palladium, silver, cadmium and indium with a polymer or prepolymer composition at a temperature and pressure appropriate for obtaining a polymer composition having a surface layer comprising an intermetallic compound of antimony and the metal element B.

13. The process of claim 12 wherein said layer of metal element B constitutes the surface layer of a body consisting essentially of said metal element B.

14. The process of claim 12 wherein said layer of metal element B is a layer deposited upon an inert release substrate.

15. The process of claim 12 wherein said metallizing conditions include a pressure in the range of from about 100 kPa to about 10 MPa to effect said contact.

16. The process of claim 12 wherein said metallizing conditions include a temperature range of from ambient temperature to about 600° C.

17. The process of claim 16 wherein said metallizing conditions include a temperature of from about 125° to about 375° C.

18. A process of claim 12 wherein at least part of said surface layer is further plated by deposition of additional metal.

* * * * *